US012592716B2

(12) United States Patent
Swindlehurst et al.

(10) Patent No.: US 12,592,716 B2
(45) Date of Patent: Mar. 31, 2026

(54) ADAPTIVE POWER TUNING IN A SUCCESSIVE APPROXIMATION ANALOG-TO-DIGITAL CONVERTER

(71) Applicant: Cypress Semiconductor Corporation, San Jose, CA (US)

(72) Inventors: Eric Swindlehurst, Marysville, WA (US); Gajender Rohilla, Tucson, CA (US)

(73) Assignee: Infineon Technologies Americas Corp., El Segundo, CA (US)

( * ) Notice: Subject to any disclaimer, the term of this patent is extended or adjusted under 35 U.S.C. 154(b) by 112 days.

(21) Appl. No.: 18/672,806

(22) Filed: May 23, 2024

(65) Prior Publication Data

US 2024/0396569 A1 Nov. 28, 2024

Related U.S. Application Data

(60) Provisional application No. 63/468,995, filed on May 25, 2023.

(51) Int. Cl.
H03M 1/46 (2006.01)
H03M 1/00 (2006.01)
(Continued)

(52) U.S. Cl.
CPC ........... H03M 1/462 (2013.01); H03M 1/002 (2013.01); H03M 1/1255 (2013.01);
(Continued)

(58) Field of Classification Search
CPC .... H03M 1/462; H03M 1/002; H03M 1/1255; H03M 1/468; H03M 1/466; H03M 1/804
See application file for complete search history.

(56) References Cited

U.S. PATENT DOCUMENTS 7,741,981 B1 6/2010 Wan et al.
8,446,307 B2 * 5/2013 Johansson ............ H03K 5/2481
341/155

(Continued)

OTHER PUBLICATIONS

WO Search Report and Written Opinion from Application (PCT/US24/31019) dated Oct. 18, 2024; 16 pages.

*Primary Examiner* — Khai M Nguyen

(57) ABSTRACT
A Successive Approximation Analog-to-Digital Converter (SAR_ADC) and method of operating the same are provided. Generally, the SAR_ADC includes a comparator having a first input to receive an input voltage ($V_{IN}$), and a second input coupled to a n-bit capacitive digital-to-analog converter (DAC) to receive a voltage ($V_{DAC}$), a Successive Approximation Register (SAR) coupled to a comparator output to provide n digital control signals to the DAC, and to store and output an n-bit binary-number approximating $V_{IN}$, and a reference buffer to provide a voltage ($V_{REF}$) to the DAC. The DAC sequentially drives each capacitance beginning with a most significant bit towards $V_{REF}$, while the comparator compares the resulting $V_{DAC}$ to $V_{IN}$, and the SAR sets or clears a current bit represented by the capacitance driven. The reference buffer includes adaptive power tuning to dynamically tune a drive-strength of the reference buffer based on the current bit.

20 Claims, 5 Drawing Sheets

(51) Int. Cl.
  *H03M 1/12* (2006.01)
  *H03M 1/80* (2006.01)

(52) U.S. Cl.
  CPC ........... *H03M 1/466* (2013.01); *H03M 1/468* (2013.01); *H03M 1/804* (2013.01)

(56) References Cited

U.S. PATENT DOCUMENTS

| | | | |
|---|---|---|---|
| 9,154,151 B1 * | 10/2015 | Leong .................. | H03M 1/182 |
| 9,362,939 B1 | 6/2016 | Rath et al. | |
| 10,218,376 B1 | 2/2019 | Collins et al. | |
| 2015/0263744 A1 | 9/2015 | Sharma et al. | |
| 2022/0239307 A1 | 7/2022 | Kinyua et al. | |

* cited by examiner

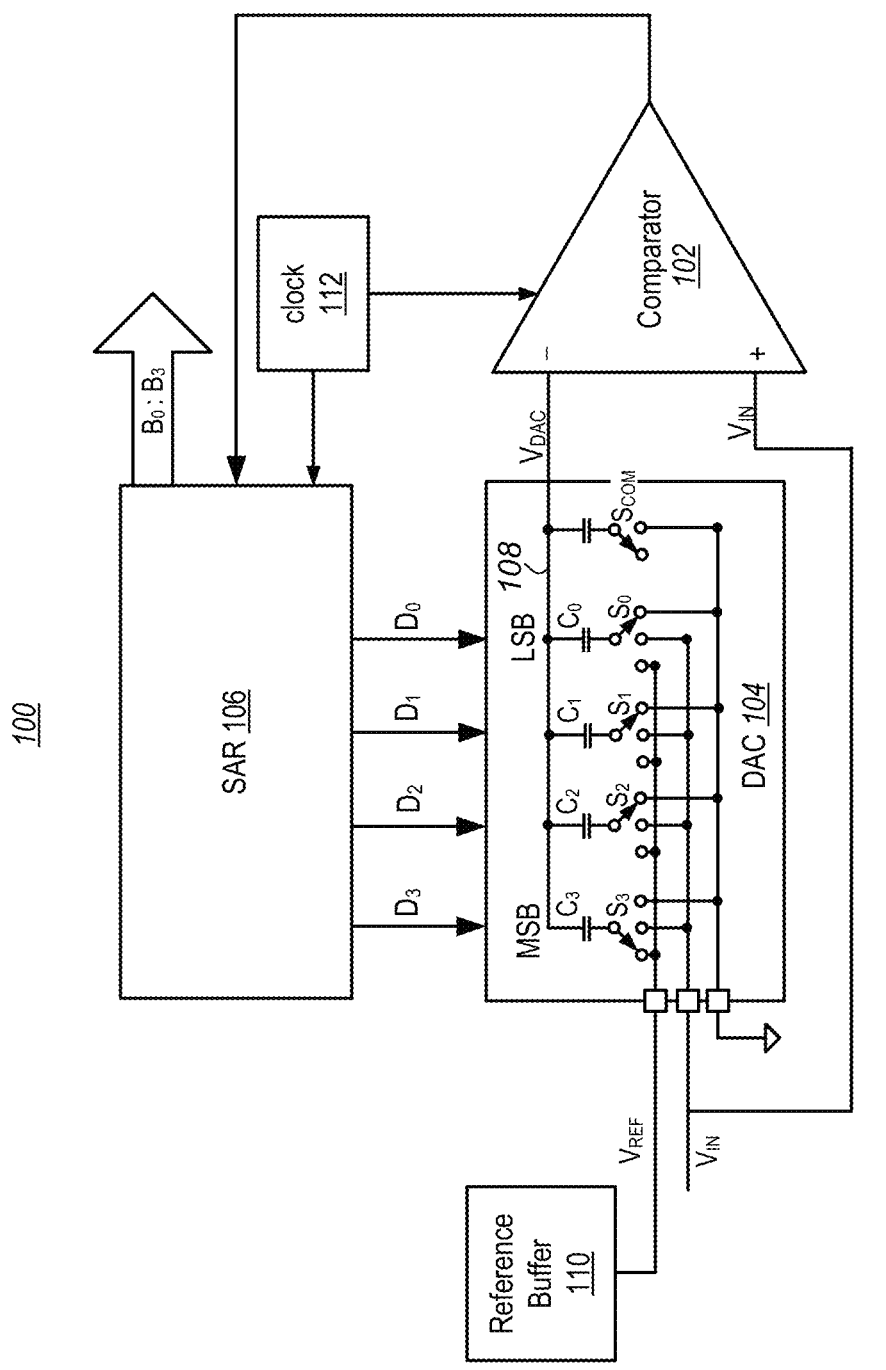
*FIG. 1 (conventional)*

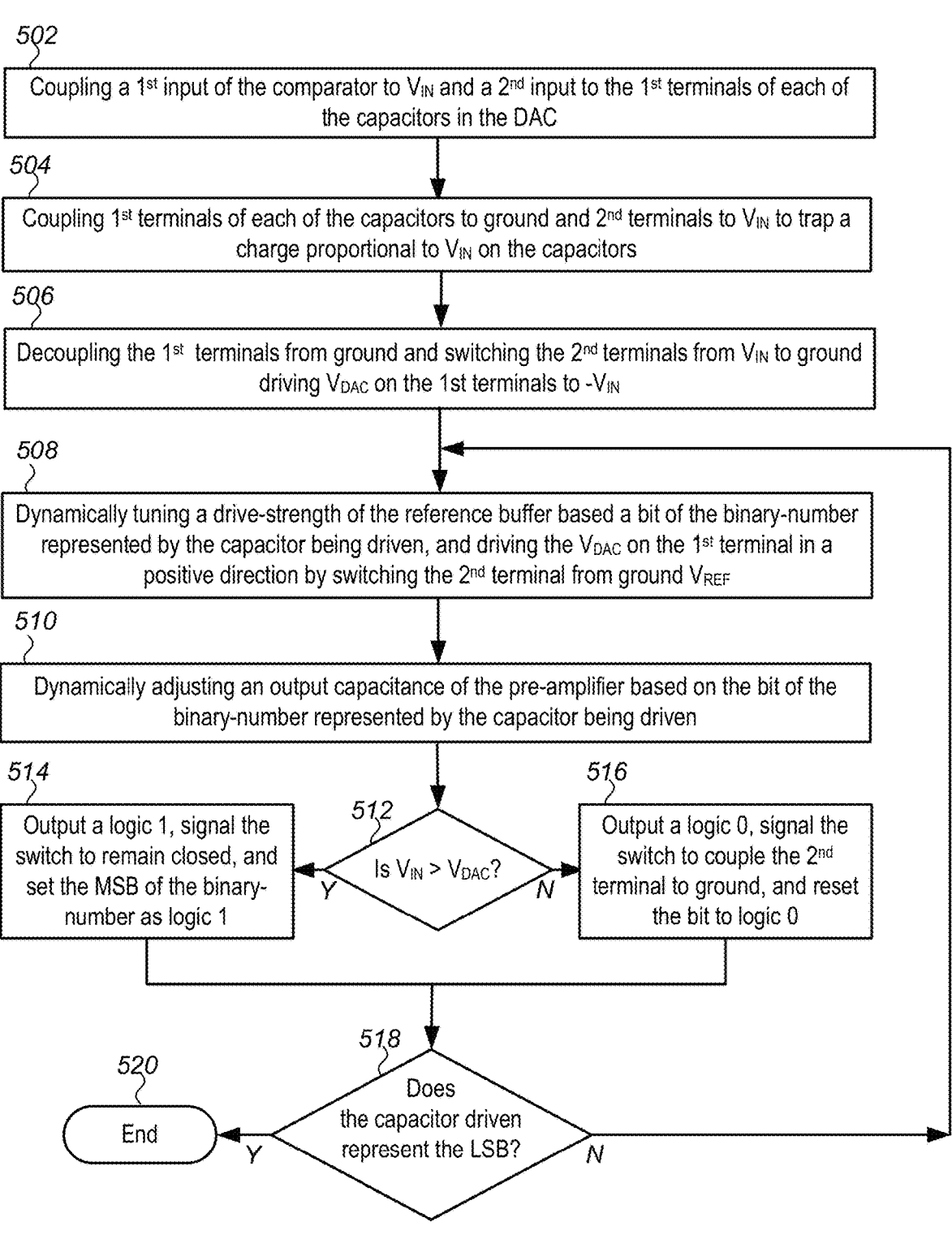

502

Coupling a 1st input of the comparator to $V_{IN}$ and a 2nd input to the 1st terminals of each of the capacitors in the DAC

504

Coupling 1st terminals of each of the capacitors to ground and 2nd terminals to $V_{IN}$ to trap a charge proportional to $V_{IN}$ on the capacitors

506

Decoupling the 1st terminals from ground and switching the 2nd terminals from $V_{IN}$ to ground driving $V_{DAC}$ on the 1st terminals to $-V_{IN}$

508

Dynamically tuning a drive-strength of the reference buffer based a bit of the binary-number represented by the capacitor being driven, and driving the $V_{DAC}$ on the 1st terminal in a positive direction by switching the 2nd terminal from ground $V_{REF}$

510

Dynamically adjusting an output capacitance of the pre-amplifier based on the bit of the binary-number represented by the capacitor being driven

514

Output a logic 1, signal the switch to remain closed, and set the MSB of the binary-number as logic 1

512

Is $V_{IN} > V_{DAC}$?

Y                    N

516

Output a logic 0, signal the switch to couple the 2nd terminal to ground, and reset the bit to logic 0

520

End

Y

518

Does the capacitor driven represent the LSB?

ADAPTIVE POWER TUNING IN A SUCCESSIVE APPROXIMATION ANALOG-TO-DIGITAL CONVERTER

CROSS-REFERENCE TO RELATED APPLICATIONS

This application claims the benefit of priority under 35 U.S.C. 119 (e) to U.S. Provisional Patent Application Ser. No. 63/468,995, filed May 25, 2023, the entire contents of which are incorporated herein by this reference.

TECHNICAL FIELD

This disclosure relates generally to Analog-to-Digital Converters (ADCs), and more particularly to successive-approximation-register ADCs (SAR_ADCs) and methods of operating the same.

BACKGROUND

A successive-approximation-register analog-to-digital converter or SAR_ADC is an electrical circuit that converts an analog voltage or waveform into a discrete digital representation using a binary search through all possible quantization levels before finally converging upon a digital output for each conversion. SAR_ADC's are widely used in low cost applications requiring medium to high-resolution ADCs.

FIG. 1 is a schematic block diagram illustrating a conventional four (4) bit SAR_ADC. Referring to FIG. 1, the SAR_ADC 100 consists of several blocks, including a comparator 102 having a first or non-inverting input coupled to an analog input voltage ($V_{IN}$) to be converted into a DC voltage approximated by a multibit binary-number, a second or inverting input coupled to a capacitive digital-to-analog-converter (DAC 104), and a successive approximation register block (SAR 106). The DAC 104 includes an array of capacitors ($C_0$:$C_3$) coupled between an output of the DAC and through an equal number of switches ($S_0$:$S_3$) to inputs, including a reference voltage ($V_{REF}$), $V_{IN}$ and ground. 104 further includes a switch ($S_{COM}$) through which a common terminal 108 connecting upper terminals of all capacitances to the DAC output can be coupled to ground.

The SAR 106 includes both a number of registers to store digits of the binary number, and control or logic circuits to control both the registers and to provide digital-signals ($D_0$:$D_3$) to the DAC 104 to control the switches ($S_{COM}$ and $S_0$:$S_3$) to implement a binary search algorithm. Generally, the SAR_ADC 100 further includes a reference buffer 110 to provide a reference voltage ($V_{REF}$) to the DAC 104, and a clock 112 to synchronize bitwise operation of the sub-circuits or blocks of the SAR_ADC, including the comparator 102 and DAC 104.

In operation, the common terminal 108 is connected to ground through $S_{COM}$, and the lower terminals of all capacitances are connected to $V_{IN}$ through switches $S_0$ to $S_3$. Thereafter, the common terminal 108 and the lower terminals of all capacitances are disconnected from ground, trapping a charge proportional to $V_{IN}$ on the capacitance array and connected ground. The lower terminals of all capacitances are then connected to ground, driving the common terminal 108 to a negative voltage equal to $-V_{IN}$. In a first step of the binary search algorithm, the lower terminal of a most significant bit (MSB) capacitance ($C_3$) is disconnected from ground and connected to $V_{REF}$, driving the common terminal 108 in the positive direction by an amount equal to $\frac{1}{2}V_{REF}$. Thus, $V_{DAC}$ on the common terminal 108 coupled to the second input of the comparator 102 is:

$$V_{DAC} = -V_{IN} + V_{REF}/2$$

The comparator 102 compares $V_{DAC}$ to $V_{IN}$ and if $V_{DAC} < V_{IN}$ outputs a logic 1 to the SAR 106, which stores it as the MSB of the binary-number and causes the $SW_3$ to remain set or latched to $V_{REF}$. Conversely, if $V_{DAC} > V_{IN}$ the comparator 102 outputs a logic 0, which is stored as the MSB and resets $SW_3$ coupling $C_3$ to ground. The binary search algorithm is repeated for a next MSB, i.e., MSB−1 or $C_2$, and the process continued until all capacitances have been checked and a 4-bit digital value closest to $V_{IN}$ has been reached.

One problem with existing or conventional SAR_ADCs 100 is that several of the analog blocks, such as the comparator 102, the DAC 104 and the reference buffer 110 are very power hungry. An additional problem is that these blocks are designed to meet minimum requirements for noise and settling. Conventional designs require the comparator's noise profile to be at or below quantization noise, and the reference voltage ($V_{REF}$) must settle to within ½ of the charge of the capacitance ($C_0$) representing a least significant bit (LSB). Many designs introduce the concept of redundancy in the DAC to help alleviate settling and noise requirements. While the resulting reduced settling requirements introduced by redundancy generally results in lower power requirements, this introduces increased complexity and additional SAR search steps, the resulting in increased costs.

Accordingly, there is a need for a SAR_ADC and methods of operating the same to reduce power demands while meeting or exceeding settling requirements, without unduly increasing design complexity or costs.

SUMMARY

Disclosed is a Successive Approximation Analog-to-Digital Converter (SAR_ADC) and method of operating the same to reduce power demands while meeting settling requirements, without to increasing complexity or cost through redundancy in the DAC or SAR. Generally, the SAR_ADC includes a comparator having a first input to receive an input voltage ($V_{IN}$), and a second input coupled to a n-bit capacitive digital-to-analog converter (DAC) to receive a voltage ($V_{DAC}$), a Successive Approximation Register (SAR) coupled to a comparator output to provide digital control signals to the DAC, and to store and output an n-bit binary-number approximating $V_{IN}$, where n is a natural number; and a reference buffer to provide a voltage ($V_{REF}$) to the DAC. The DAC includes a number of capacitances ($C_0$: $C_{n+r-1}$), where n is equal to the number of bits of resolution in the SAR_ADC and r is a number of additional, redundant capacitors in the DAC array for resolving a number of most significant bit (MSB) of the n-bit binary-number approximating or representing $V_{IN}$. Each of the number of capacitors ($C_0$: $C_{n+r-1}$), have a first terminal coupled to a DAC output node and a second terminal coupled through a switch controlled by one of n digital-signals from the SAR to a $V_{IN}$ node, a $V_{REF}$ node or ground. The DAC is operable to sequentially drive each of the capacitances beginning with that representing a MSB of the n-bit binary-number towards $V_{REF}$. The reference buffer includes an adaptive power tuning circuit operable to dynamically tune the drive strength of the reference buffer based on which bit of the n-bit binary-number represented by the capacitance being driven.

Generally, the adaptive power tuning circuit includes m parallel drive-paths to provide $V_{REF}$ to the $V_{REF}$ node of the DAC, where m is a natural number $\leq$n, the m parallel drive-paths including at least a first drive-path operable to drive all n capacitances of the DAC, a second drive-path operable to drive fewer than n capacitances of the DAC including the capacitance representing the MSB of the n-bit binary-number. In one embodiment, the adaptive power tuning circuit further includes a third drive-path operable to drive capacitances representing bits greater than a least significant bit (LSB) of the n-bit binary-number, and the capacitances representing the MSB and second MSB are driven through the first, second and third drive-paths, the capacitances representing bits between the second MSB and the LSB are driven through only the first drive-path.

The comparator includes a pre-amplifier coupled to the first and second input of the comparator and a set-reset (SR) latch coupled between a pre-amplifier output and the comparator output, and is operable to compare $V_{IN}$ to the $V_{DAC}$ resulting from the capacitance being driven by the DAC, and to set or clear a current bit represented by the capacitance driven. In one embodiment, the comparator further includes a number of variable-capacitance elements coupled to the pre-amplifier output, the variable-capacitance elements operable to adjust an output-capacitance of the pre-amplifier based on the bit of the n-bit binary-number represented by the capacitance being driven by the DAC and compared by the comparator. The variable-capacitance element is operable to adjust an output capacitance of the pre-amplifier per bit as the DAC sequentially drives each of the capacitances from that representing the MSB to that representing the LSB. The noise profile of the comparator is inversely proportional to the amount of capacitance connected to the output of the pre-amplifier. Redundant capacitors used for resolving the MSBs allow for toleration of increased noise and settling timers, however since redundancy is not available for the LSB of the n-bit binary-number, the variable-capacitance element is adjusted to increase the output capacitance of the pre-amplifier to reduce the noise for the LSBs to meet desired settling and noise parameters.

Further features and advantages of embodiments of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to a person skilled in the relevant art(s) based on the teachings contained herein.

BRIEF DESCRIPTION OF THE DRAWINGS

Embodiments of the invention will now be described, by way of example only, with reference to the accompanying schematic drawings in which corresponding reference symbols indicate corresponding parts. Further, the accompanying drawings, which are incorporated herein and form part of the specification, illustrate embodiments of the present invention, and, together with the description, further serve to explain the principles of the invention and to enable a person skilled in the relevant art(s) to make and use the invention.

FIG. 1 is a schematic block diagram illustrating a conventional Successive Approximation Register Analog-to-Digital Converter (SAR_ADC);

FIG. 5 is a flowchart illustrating a method for operating the SAR_ADC of FIG. 2 to same to reduce power demands and improve accuracy.

DETAILED DESCRIPTION

A Successive Approximation Analog-to-Digital Converter (SAR_ADC) and method of operating the same to convert or provide output an n-bit binary-number approximating an analog input voltage ($V_{IN}$), while reducing power demands of the converter and meeting settling requirements is disclosed. Generally, the SAR_ADC includes a comparator having a first input to receive an input voltage ($V_{IN}$), and a second input coupled to a n-bit capacitive digital-to-analog converter (DAC) to receive a voltage ($V_{DAC}$), a Successive Approximation Register (SAR) coupled to a comparator output to provide digital control signals to the DAC, and to store and output an n-bit binary-number approximating $V_{IN}$, where n is a natural number; and a reference buffer to provide a voltage ($V_{REF}$) to the DAC. The DAC includes a number of capacitances, at least one for each bit of the n-bit binary-number, each with a first terminal coupled to a DAC output node and a second terminal coupled through a switch controlled by one of n digital-signals from the SAR to a $V_{IN}$ node, a $V_{REF}$ node or ground. Generally, the number of capacitances in the DAC is greater than n, and includes a number of redundant capacitances coupled in parallel for resolving a number of the most significant bits (MSBs) of the n-bit binary-number. That is a total number of capacitances in the DAC or DACs is equal to the sum of n and r, where n is the number of bits in the n-bit binary-number to be output from the SAR_ADC, and r is the number of redundant capacitances. For example, a 12-bit DAC can include 12 capacitances for each bit of the 12-bit binary-number, and one redundant capacitance for a total of 13 capacitances ($C_0$: $C_{n+r-1}$). The DAC is operable to sequentially drive each of the capacitances beginning with that representing a most significant bit (MSB) of the n-bit binary-number towards $V_{REF}$. The reference buffer includes an adaptive power tuning circuit operable to dynamically tune a drive-strength of the reference buffer based a bit of the n-bit binary-number represented by the capacitance being driven.

Figure 2:
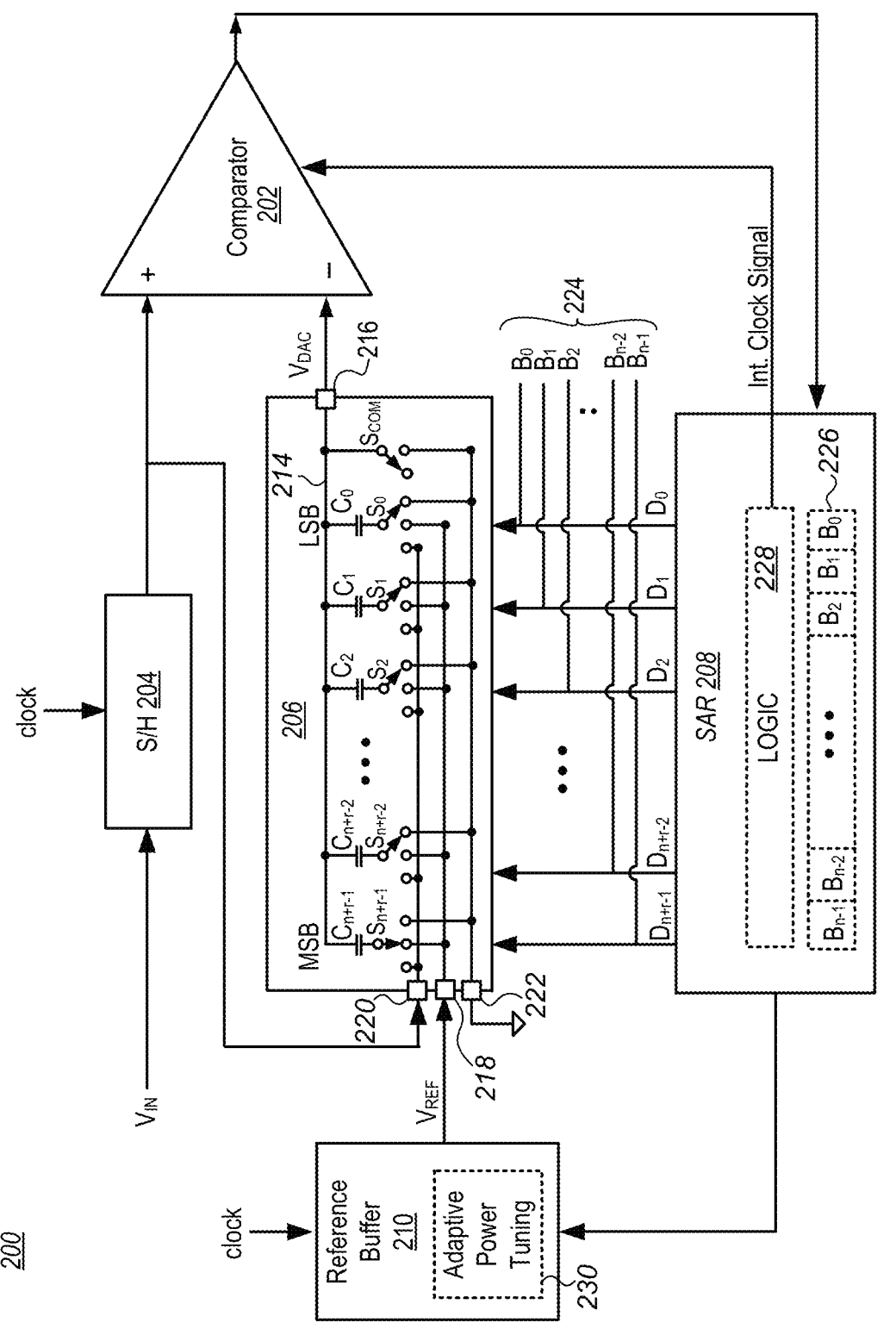
FIG. 2 is a schematic block diagram illustrating a SAR_ADC including adaptive power tuning.
Figure 3:
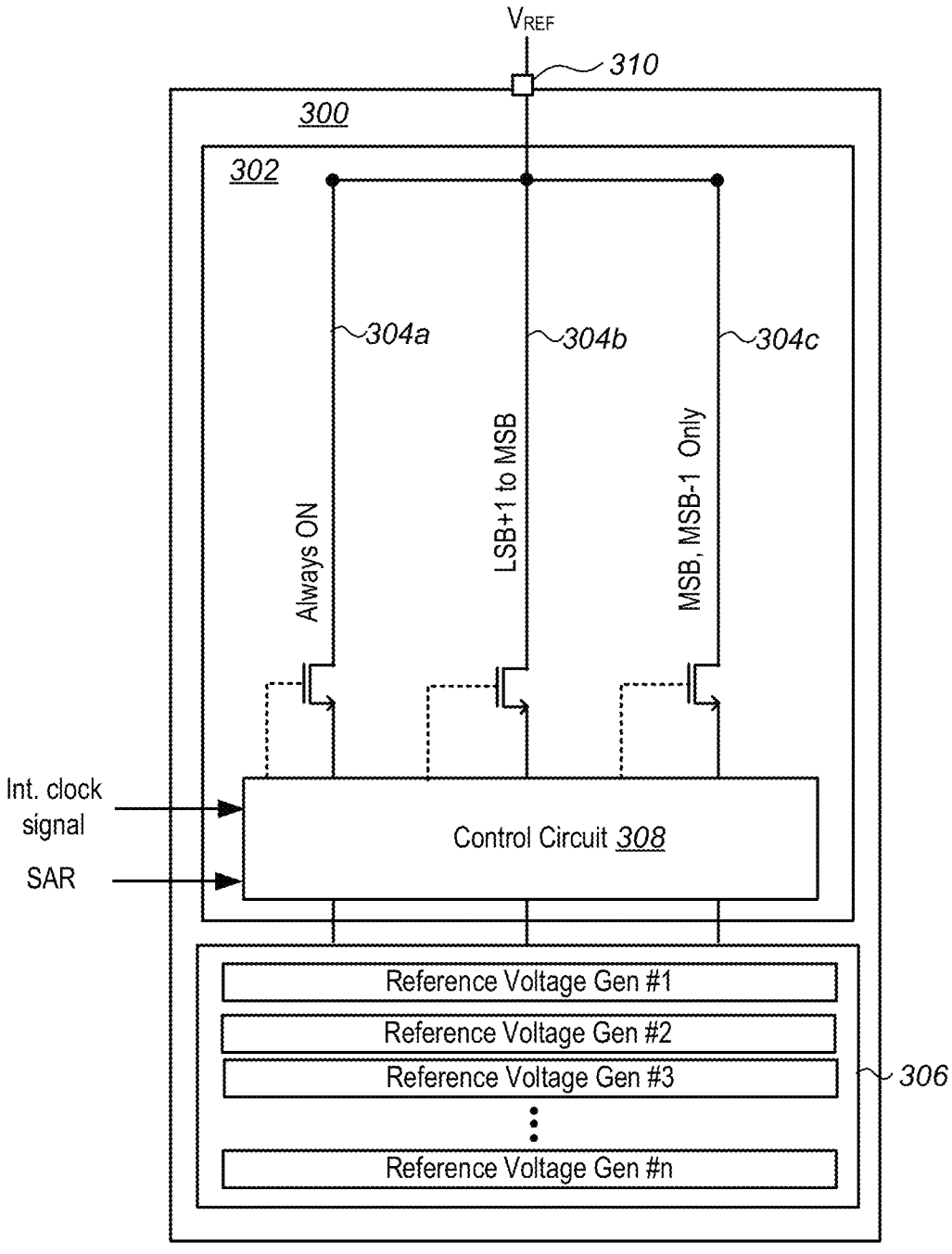
FIG. 3 is a schematic block diagram illustrating a portion of the reference buffer of the SAR_ADC of FIG. 2 including an adaptive power tuning circuit.
Figure 4:
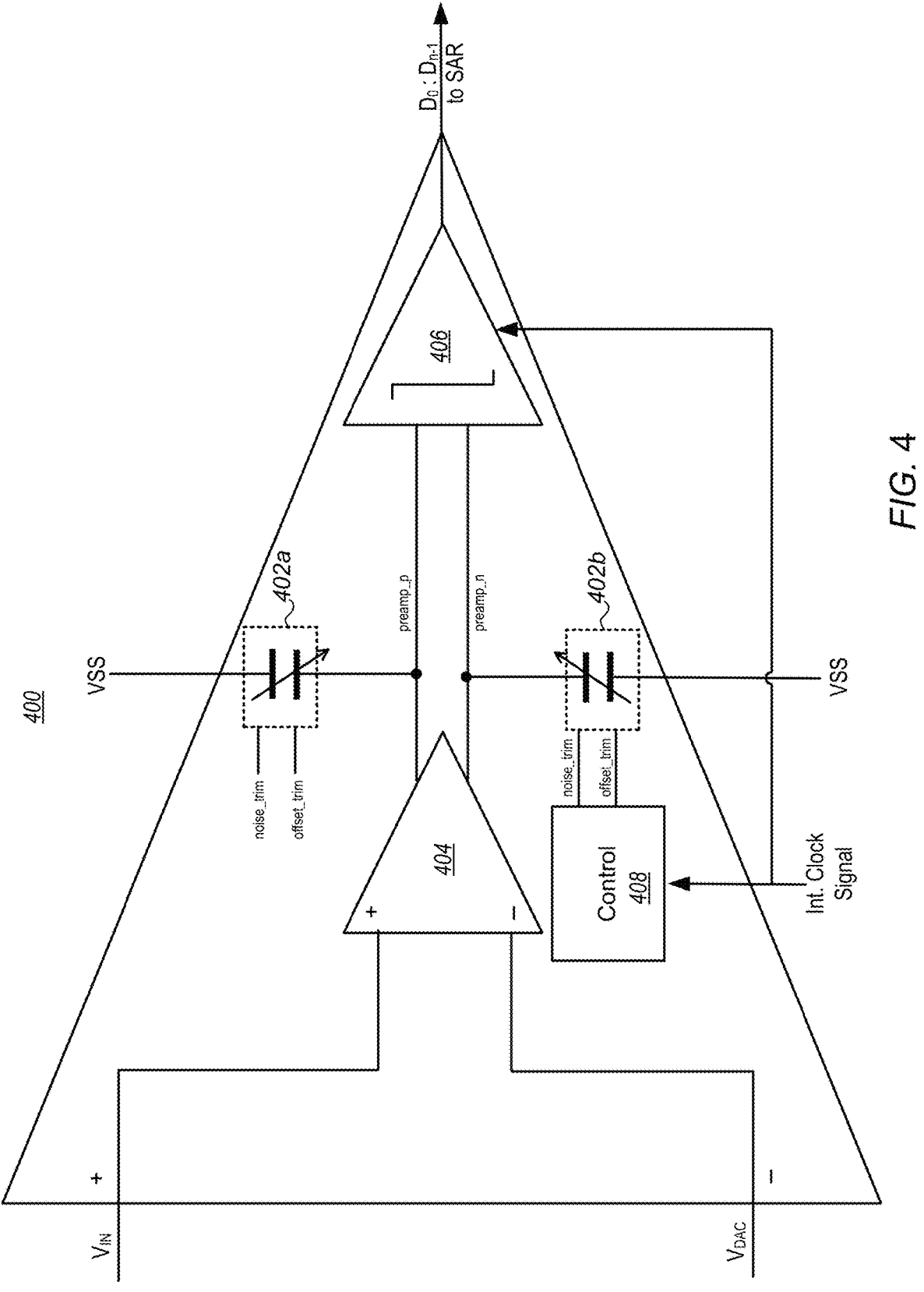
FIG. 4 is a schematic block diagram illustrating a portion of the comparator in the SAR_ADC of FIG. 2, including an element for adjusting an output capacitance of a pre-amplifier therein comparator on a per bit basis to reduce power requirements without compromising accuracy.

In one embodiment, the comparator includes a pre-amplifier coupled to the first and second input of the comparator and a set-reset (SR) latch coupled between a pre-amplifier output and the comparator output, and further includes a number of variable-capacitance elements coupled to the pre-amplifier output The variable-capacitance elements are operable to adjust an output-capacitance of the pre-amplifier based on the bit of the n-bit binary-number represented by the capacitance being driven by the DAC and compared by the comparator Embodiments of the SAR_ADC will now be described in greater detail with reference to FIGS. 2 through 4.

FIG. 2 is a schematic block diagram illustrating a SAR_ADC in accordance with an embodiment of the present disclosure.

Referring to FIG. 2, the SAR_ADC 200 generally includes a number of blocks, which may be implemented as separate interconnect circuits or advantageously integrally formed in a single integrated circuit (IC) chip. In the embodiment shown, the SAR_ADC 200 includes a comparator 202 having a first or non-inverting input coupled to receive an analog waveform or input voltage (VIN) through a sample and hold (S/H) block 204 and a second or inverting input coupled to a multibit capacitive digital-to-analog converter block or DAC 206, a successive-approximation-register block or SAR 208, a reference buffer 210 to provide a reference voltage (VREF) to the DAC. Generally, the SAR_ADC 200 is asynchronous, including an internal clock (not shown), but receiving an external clock signal only to begin the conversion, and not to synchronize bitwise operation of the SAR_ADC.

As noted above, the DAC 206 includes in addition to the n-capacitances, each associated with a bit of the n-bit binary-number, a number (r) of redundant capacitances for resolving the MSBs of the n-bit binary-number. The redundant capacitances can be implemented either as discrete capacitances within a single array of parallel capacitances or as one more parallel arrays of capacitors or DACs 206. In the embodiment shown, the DAC 206 includes a single array of parallel capacitances ($C_0$: $C_{n+r-1}$) including n capacitances, each associated with one bit of the n-bit DAC plus a number (r) redundant capacitances. Each capacitance has a first or upper plate or terminal coupled through a common terminal 214 to an output node 216, and a second or lower plate or terminal coupled through one of an equal number of switches ($S_0$: $Sn_{-1}$) to a number of input nodes, including a $V_{REF}$ node 218, a $V_{IN}$ node 220 and an electrical ground node or ground 222. The DAC 206 further includes a switch ($S_{COM}$) through which the common terminal 214 can be coupled to ground in an acquisition or provisioning step to place a charge proportional to $V_{IN}$ on the array of capacitances ($C_0$: $C_{n-1}$). It will be understood that although each of the parallel capacitances $C_0$: $C_{n+r-1}$ are shown in FIG. 2 as a single capacitance, and referred to herein interchangeably as capacitances or capacitances, the actual implementation of each capacitance can include multiple parallel capacitances.

Generally, the number of capacitances or capacitances $C_0$:$C_{n+r-1}$ is greater than the number of bits ($B_0$:$B_{n-1}$) in a binary-number 224 to be output from the SAR_ADC 200. A total capacitance associated with each bit of the n-bit binary-number is binary weighted to have value corresponding to or representing one bit of the n-bit binary-number. By binary weighted it is meant if capacitance $C_0$ representing a first or least significant bit (LSB) of the binary number has a capacitance of C ($C·2^0$), the next bit or capacitance $C_1$ has a capacitance of $C·2^1$ or 2C, and the most significant bit (MSB) has a capacitance of $C·2^{n-1}$. Thus, each successive capacitance has twice the capacitance of the preceding capacitance. The exact number of capacitances is selected based on a desired resolution for the SAR_ADC 200, and generally includes n capacitances plus the number (r) redundant capacitances, and can be any natural number between 4 and 18. For example, for a four (4) bit DAC with a reference voltage ($V_{REF}$) the MSB is capable of resolving $V_{IN}$ within $\frac{1}{2}·V_{REF}$ or 2.5V, the next bit, MSB−1, within $\frac{1}{4}V·V_{REF}$ or 1.25V, the next bit, MSB−2, of $\frac{1}{8}V·V_{REF}$ or within 0.6250V and LSB within $\frac{1}{16}V·V_{REF}$ or 0.3125V, therefore a 4-bit SAR_ADC with a $V_{REF}$ of 5V has a resolution of 0.3125V.

In general the approximated voltage output from the DAC 206 is equal to:

$$-V_{IN} + B_{n-1} \times V_{REF}/2^{n-1} +$$
$$B_{2n-2} \times V_{REF}/2^{n-2} + \dots B_1 \times V_{REF}/2^1 + B_0 \times V_{REF}/2^0$$

where Bx is the logic bit value, 1 or 0, of the bit resolved.

The SAR 208 includes a number of registers 226 to store digits of the n-bit binary-number 224, and control circuits or logic 228 to read and write to the registers and to provide digital-signals ($D_0$:$D_{n-1}$) to control the switches ($S_{COM}$ and $S_0$:$S_3$) in the DAC 206 to implement a binary search algorithm. It will be understood that as shown in FIG. 2 the logic values, 1 or 0, of each of the digital-signals ($D_0$:$D_{n-1}$) are the same as the corresponding bits of the n-bit binary-number 224 stored in a register 226 in the SAR 208 and output from the SAR_ADC 200. The total number of capacitances in the DAC 206 includes a number (r) of redundant capacitances, and thus is greater than n. As noted above, the redundant capacitances can be implemented either as discrete.

The reference buffer 210 includes one or more reference voltage generators (not show) and is configure or operable to provide a constant, DC reference voltage ($V_{REF}$) to the DAC 206 to charge or drive the capacitances ($C_0$: $C_{n+r-1}$) in the DAC during execution of the binary search algorithm. The precise value of $V_{REF}$ is selected based on a range of expected or projected input voltages ($V_{IN}$) based on an application in which the SAR_DAC 200 will be used. Generally, the $V_{REF}$ is selected to be constant, DC voltage greater than or equal to the projected $V_{IN}$. For example, for many consumer and industrial applications including micro control units (MCU) or integrated circuits, such as a programmable system on a chip or PSoC™ commercially available from Cypress Semiconductor, $V_{REF}$ can include a DC voltage of between about 5V to about 20V.

Additionally, as noted above the reference buffer 210 further includes an adaptive power tuning block or circuit 230 configured or operable to operable to dynamically adjust or tune a drive-strength of the reference buffer 210 output based a bit of the n-bit binary-number represented by the capacitance ($C_0$: $C_{n+r-1}$) being driven. Capacitances ($C_{n+r-1}$, $C_{n+r-2}$, and $C_{n+r-3}$) in DAC 206 corresponding to or associated with the most significant bits in the n-bit binary-number 224 have larger capacitances and require greater drive strength or current to drive or charge them to $V_{REF}$. Thus, conventional SAR_ADCs have typically had reference buffers designed to meet the requirements for charging these larger capacitances in a timely manner. This has led to excessive drive strengths for the smaller capacitances, i.e., the LSB, LSB+1, etc., . . . , resulting power being wasted in in the reference buffer and DAC. Additionally, the capacitances associated with or representing the LSBs have the highest resolution or precision requirements needing to be driven to the at least ½ the LSB voltage (Vref/$2^n$).

Briefly, the adaptive power tuning circuit 230 adjusts or tunes the drive-strength by operating one or more of a number (m) of parallel drive-paths to drive or charge the capacitance being driven, depending on a bit value of the bit in the n-bit binary-number 224 represented by the capacitance. The number (m) parallel drive-paths can include any natural number greater than two (2) where m is ≤n, that is the number of capacitances in the DAC 206.

The adaptive power tuning circuit 230 will now be described in greater detail hereafter with reference to FIG. 3. FIG. 3 is a schematic block diagram illustrating a portion of the reference buffer 210 of the SAR_ADC 200 of FIG. 2 including the adaptive power tuning circuit 230. Referring to FIG. 3, the reference buffer 300 generally includes, in addition to an adaptive power tuning circuit 302 having a number (m) of one more parallel drive-paths 304a, 304b, 304c, one or more reference voltage generators 306, such a bandgap reference voltage generator or a regulated charge pump. It is noted that these multiple reference voltage generators 306 where included are operable to provide different reference voltage (V$_{REF}$) levels to extend a range of input voltages (VIN) for which the SAR_ADC 200 can provide conversion. The multiple reference voltage generators 306 are not intended or connected to provide different reference voltage (V$_{REF}$) to each of the parallel drive-paths 304a, 304b, and 304c.

In addition to the number (m) of one more parallel drive-paths 304a, 304b, 304c, the adaptive power tuning circuit 302 further includes a control circuit 308 coupled between the reference voltage generators 306 and an output 310 of the reference buffer 300. The control circuit 308 is configured or operable to enable one or more of the parallel drive-paths 304a, 304b, 304c, depending on the capacitance (C$_0$: C$_{n-1}$) in the DAC 206 being driven, and to dynamically change the parallel drive-paths enabled as the binary search stage of the conversion progresses. In particular, in the embodiment shown in FIG. 3 the adaptive power tuning circuit 302 includes three parallel drive-paths, including a first drive-path 304a, which is always enabled, a second drive path 304b, which is enabled only when driving a capacitance associated with or representing the MSB (C$_{n-1}$) or the second most significant bit (MSB−1) (C$_{n-2}$), and a third drive path 304c, which is enabled when driving capacitances C$_{n-5}$ through C$_{n-1}$). The capacitances representing the MSB and second MSB are driven through the first, second and third drive-paths 304a, 304b, 304c, the capacitances representing bits greater than a least significant bit (LSB), i.e., the MSB through the LSB+1, are driven through the first drive-path 304a and the third drive-path 304c, while the capacitance representing the LSB is driven through only the first drive-path 304a. It is noted that the current through each of the three parallel drive-paths 304a, 304b, and 304c is weighted, and therefore a quanta of charge driven onto a capacitance 304a is roughly equal to the sum of 304b and 304c. Thus, the charge driven onto the capacitances (C$_{n+r-1}$, C$_{n+r-2}$) representing the MSB and the second MSB is two (2) times greater than that driven onto the capacitance (C$_0$) representing the LSB, and the charge driven onto the capacitance (C$_{n+r-3}$ to C$_1$ representing the bits between the second MSB and the LSB is one and half (1.5) times greater than that driven onto the capacitance (C$_0$) representing the LSB.

The control circuit 308 can identify the bit or capacitance currently being driven either from a clock signal available in the reference buffer 300 or from a separate signal provided to the reference buffer from the SAR 208, as shown in FIG. 2, or a signal from the DAC 206.

Advantages realized by the above approach include faster settling times for resolving the most significant bits, reduced power requirements in reference buffer 210 and DAC 206 when driving smaller capacitances or least significant bits without adding any errors related to settling.

It has been found that a SAR_ADC with a reference buffer 210 including an adaptive power tuning circuit as described herein can match or exceed the performance of a conventional SARADC with respect to quantization noise and sample or conversion speeds, at much lower power requirements. Studies performed on the SAR_ADC 200 with a reference buffer 210 including an adaptive power tuning circuit 230 with three (3) parallel drive-paths show a greater than thirty percent (30%) decrease in reference buffer current from 120 microamperes (μA) to 80 μA with a corresponding decrease in quantization noise in the DAC 206. Further improvements are projected for adaptive power tuning circuit 230 including a greater number of parallel drive-paths.

In another aspect or embodiment, the comparator 202 of FIG. 2 includes a number of internal, variable capacitance elements to further reduce noise and improve accuracy of the SAR_ADC 200. FIG. 4 is a schematic block diagram illustrating a portion of one embodiment of such a comparator 400 including variable capacitance elements 402a, 402b, for adjusting an output capacitance of a pre-amplifier 404 on a per bit basis. The variable-capacitance elements 402a, 402b, are operable to adjust an output capacitance of the pre-amplifier 404 per bit as the DAC 206 sequentially drives each of the capacitances from that representing the MSB to that representing the LSB. The noise profile of the comparator 400 is inversely proportional to the amount of capacitance connected to the output of the pre-amplifier 404. Redundant capacitors used for resolving the MSBs allow for toleration of increased noise and settling timers, however since redundancy is not available for the LSBs, the variable-capacitance elements 402a and 402b are adjusted to increase the output capacitance of the pre-amplifier 404 to reduce the noise for the LSBs to meet desired settling and noise parameters.

Referring to FIG. 4 the comparator 400 further includes a differential amplifier or latch 406 having inputs coupled to outputs of the pre-amplifier 404 and control circuit 408 for controlling the variable capacitance elements 402a, 402b, to adjust the output capacitance of the pre-amplifier 404. In operation, during a binary search stage the comparator 400 receives and couples V$_{IN}$ to a first, non-inverting input of the pre-amplifier 404, and V$_{DAC}$ to a second, inverting input. The pre-amplifier 404 amplifies a difference between V$_{IN}$ and V$_{DAC}$ and couples a positive output (preamp_p) and a negative output (preamp_n) to inputs of the latch 406. The latch compares these inputs and a bit value (logic 0 or a logic 1) to the SAR for the bit (B$_0$: B$_{n-1}$) currently being compared. Prior to this or at substantially the same time, the control circuit 408 identifies the bit currently being compared and controls the variable capacitance elements 402a, 402b, to dynamically adjust the output capacitance of the pre-amplifier 404 on a per bit basis. Generally, adjusting the output capacitance of the pre-amplifier 404 is accomplished by signaling the variable-capacitance elements 402a, 402b, to increase output capacitance of the pre-amplifier per bit as the DAC drives the capacitances representing each bit sequentially from the MSB to a LSB of the n-bit binary-number. That is as the capacitance of the capacitance being compared decreases. The signals sent to the variable-capacitance elements 402a, 402b, can include noise-trim signals. Specific values for these signals can be stored in a look up table or register internal to the comparator or coupled thereto. The control circuit 408 can identify the bit or capacitance currently being compared either from a signal available in the comparator or from a separate signal (not shown) provided to the comparator from the DAC 206 or SAR 208.

A method for operating a SAR_ADC according to an embodiment of the present disclosure, will now be described with reference to FIGS. 2 through 4, and FIG. 5, where FIG. 5 is a flowchart illustrating the method. Referring to FIG. 5 the method begins with coupling the inverting or first input of the comparator to an input voltage ($V_{IN}$) and the non-inverting or second input to the first terminals of each of the number (N) of capacitances in the DAC (step 502). Generally, as shown in FIG. 2, the first input of the comparator is coupled to $V_{IN}$ through a sample and hold (S/H) circuit 204. The first terminals of each of the capacitances are then coupled to electrical ground or 0V, and the second terminals of the capacitances to $V_{IN}$ to trap a charge proportional to $V_{IN}$ on the n capacitances in the DAC (step 504). As shown in FIG. 2 this is accomplished by closing the common terminal switch ($S_{COM}$), and controlling or operating switches $S_0$ to $S_{n-1}$ using digital-signals ($D_0$: $D_{n-1}$) from SAR 208 to couple the lower or second terminals of the capacitances ($C_0$: $C_{n-1}$) to the $V_{IN}$ node 220 in the DAC. The input voltage ($V_{IN}$) to the $V_{IN}$ node 220 can be coupled directly from $V_{IN}$ or through the S/H circuit 204 as shown in FIG. 2. Next, the first terminals of the capacitances are disconnected or decoupled from ground, and the second terminals are switched from $V_{IN}$ to ground, driving a voltage ($V_{DAC}$) on the first terminals to or towards a negative voltage substantially equal in magnitude to the input voltage or $-V_{IN}$ (step 506). As shown in FIG. 2 this is accomplished by operating switches $S_0$ to $S_{n-1}$ using digital-signals from SAR 208 to switch the second terminals of the capacitances ($C_0$:$C_{n+r-1}$) from the $V_{IN}$ node to the ground node 222 in the DAC 206.

Beginning with the capacitance associated with or representing the most significant bit (MSB) of the n-bit binary-number, that is capacitance $C_{n+r-1}$, the drive-strength of the reference buffer 210 is dynamically tuning or adjusted based on the bit of the n-bit binary-number represented by the capacitance being driven, driving the voltage ($V_{DAC}$) on the first terminal of the capacitance in a positive direction towards $V_{IN}$ (step 508). Generally, this is accomplished by switching the second terminal from ground to the reference voltage ($V_{REF}$) from the reference buffer 210. Those capacitances representing or corresponding to the most significant bits are largest and require highest drive-strength. As shown in FIG. 3, the drive-strength is tuned by operating one or more of a plurality of drive-paths in parallel to drive or charge the capacitance. The number (m) of parallel drive-paths can include any natural number between two (2) and n, where n is the number of capacitances in the DAC 206. In the embodiment shown in FIG. 3, the number of parallel drive-paths or m is equal to three (3), and the capacitances representing the MSB ($C_{n+r-1}$) and second MSB ($C_{n+r-2}$) are driven through the first, second and third drive-paths, while the capacitances representing bits between the second MSB ($C_{n+r-2}$) and the LSB are driven through the first and third drive-paths, and the capacitance representing the LSB ($C_0$) is driven through only the first drive-path.

Optionally, where the comparator includes a pre-amplifier 404 and a latch 406 with a variable-capacitance element coupled to the pre-amplifier output, the method includes prior to comparing a DAC voltage ($V_{DAC}$) of the capacitance being driven to the input voltage ($V_{IN}$), dynamically adjusting an output capacitance of the pre-amplifier based on the bit of the n-bit binary-number represented by the capacitance being driven by the DAC and compared by the comparator (step 510). Generally, the smaller capacitances, i.e., those representing or associated with the least significant bits or LSBs, have the highest precision requirement and are most susceptible to inaccuracies caused by noise when being driven, so that the variable-capacitance element is operated to increase the output capacitance of the pre-amplifier per bit as the DAC sequentially drives each of the bits from that representing the MSB to that representing the LSB.

Next, the DAC voltage ($V_{DAC}$) coupled to the second input of the comparator 202 from the first terminal of the capacitance being driven is compared to the input voltage ($V_{IN}$) coupled to the first input (step 512). If the input voltage is greater than the DAC voltage ($V_{IN}>V_{DAC}$) the comparator 202 outputs a logic 1 to the SAR 208, causing the SAR to maintain or latch the digital-signal to the switch coupling the second terminal of the capacitance being driven causing it to remain closed, and setting the MSB of the n-bit binary-number stored in the SAR as a logic 1 (step 514). If the input voltage is less than the DAC voltage ($V_{IN}<V_{DAC}$) the comparator 202 outputs a logic 0 to the SAR 208, causing the SAR to signal the switch to couple the second terminal to ground, and resetting the MSB of the n-bit binary-number as logic 0 (step 516).

A determination is then made if the capacitance most recently being driven represents the LSB (step 518), and if so the conversion is complete and the process ends (step 520). If the capacitance most recently being driven does not represents the LSB, the control circuit in the SAR 208 is indexed to the next, sequential capacitance, for example the capacitance representing the second MSB ($C_{n+r-2}$), the conversion process continued or repeated.

Thus, a SAR_ADC including a reference buffer with an adaptive power tuning circuit, and a comparator including a variable-capacitance element operable to adjust an output capacitance of a pre-amplifier therein, based on the bit of the capacitance being driven and compared, and a methods for operating the same have been disclosed. Embodiments of the present invention have been described above with the aid of functional and schematic block diagrams illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention.

It is to be understood that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The breadth and scope of the present invention should not be limited by any of the above-described exemplary embodiments, but should be defined only in accordance with the following claims and their equivalents.

What is claimed is:

1. A Successive Approximation Analog-to-Digital Converter (SAR_ADC) comprising:

a comparator having a first input operable to receive an input voltage ($V_{IN}$), and a second input coupled to an n-bit capacitive digital-to-analog converter (DAC) to receive a DAC voltage ($V_{DAC}$), where n is a natural number;

a Successive Approximation Register (SAR) coupled to a comparator output, the SAR operable to provide digital-signals to the DAC, and to store and output an n-bit binary-number approximating $V_{IN}$; and a reference buffer coupled to and controlled by the SAR to provide a reference voltage ($V_{REF}$) to the DAC, wherein the DAC comprises a plurality of capacitances, each including a first terminal coupled to a DAC output node and a second terminal coupled through a switch controlled by one of the digital-signals to a $V_{IN}$ node, a $V_{REF}$ node or ground, the DAC operable to sequentially drive each of the capacitances beginning with that representing a most significant bit (MSB) of the n-bit binary-number towards $V_{REF}$, and wherein the reference buffer includes an adaptive power tuning circuit operable to dynamically tune a drive-strength of the reference buffer based a bit of the n-bit binary-number represented by the capacitance being driven.

2. The SAR_ADC of claim 1 wherein the plurality of capacitances in the DAC equals the number of bits (n) in the n-bit binary-number plus a number (r) of redundant capacitances, and wherein the adaptive power tuning circuit comprises m parallel drive-paths to provide $V_{REF}$ to the $V_{REF}$ node of the DAC, where m is ≤(n+r), the m parallel drive-paths including at least a first drive-path operable to drive all capacitances of the DAC, and a second drive-path operable to drive fewer than all capacitances of the DAC.

3. The SAR_ADC of claim 2 wherein the second drive-path is operable to drive all capacitances greater than that representing a least significant bit (LSB) of the n-bit binary-number.

4. The SAR_ADC of claim 3 further comprising a third drive-path operable to drive fewer capacitances than the second drive-path, including the capacitance representing the MSB and a number of subsequent capacitances representing bits between the MSB and a second least significant bit (LSB+1).

5. The SAR_ADC of claim 4 wherein the third drive-path is operable to drive only the capacitance representing the MSB and a second most significant bit (MSB–1).

6. The SAR_ADC of claim 5 wherein a charge driven onto the capacitances representing the MSB and the second MSB is 2 times greater than that driven onto the capacitance representing the LSB, and the charge driven onto the capacitance representing the bits between the second MSB and the LSB is 1.5 times greater than that driven onto the capacitance representing the LSB.

7. The SAR_ADC of claim 5 wherein the capacitances representing the MSB and second MSB are driven through the first, second and third drive-paths, the capacitances representing the second MSB (MSB–1) and the second LSB (LSB+1) and the bits there between are driven through the first and second drive-paths, and the capacitance representing the LSB is driven through only the first drive-path.

8. The SAR_ADC of claim 5 wherein the comparator is operable to compare $V_{IN}$ to the $V_{DAC}$ resulting from the capacitance being driven by the DAC, and the SAR is operable to set or clear a current bit in the n-bit binary-number represented by the capacitance driven, and wherein the comparator comprises a pre-amplifier coupled to the first input and second input and a set-reset (SR) latch coupled between a pre-amplifier output and the comparator output, and further comprising a variable-capacitance element coupled to the pre-amplifier output, the variable-capacitance element operable to adjust an output capacitance of the pre-amplifier based on the bit of the n-bit binary-number represented by the capacitance being driven by the DAC and compared by the comparator.

9. The SAR_ADC of claim 8 wherein the variable-capacitance element is operable to increase output capacitance of the pre-amplifier per bit as the DAC sequentially drives each of the bits from that representing the MSB to that representing the LSB, thereby decreasing comparator noise.

10. A Successive Approximation Analog-to-Digital Converter (SAR_ADC) comprising:

a comparator having a first input operable to receive an input voltage ($V_{IN}$), and a second input coupled to a capacitive digital-to-analog converter (DAC) to receive a DAC voltage ($V_{DAC}$), the comparator operable to compare $V_{IN}$ to the $V_{DAC}$ from the DAC;

a Successive Approximation Register (SAR) coupled to a comparator output, the SAR operable to provide digital-signals to the DAC, and to store and output a n-bit binary-number approximating $V_{IN}$; and a reference buffer coupled to and controlled by the SAR to provide a reference voltage ($V_{REF}$) to the DAC, wherein the DAC comprises a plurality of capacitances, each including a first terminal coupled to a DAC output node and a second terminal coupled through a switch controlled by one of the digital-signals to a $V_{IN}$ node, a $V_{REF}$ node or ground, the DAC operable to sequentially drive each of the capacitances beginning with that representing a most significant bit (MSB) of the n-bit binary-number towards $V_{REF}$, and wherein the comparator comprises a pre-amplifier coupled to the first input and second input and a set-reset (SR) latch coupled between a pre-amplifier output and the comparator output, and further comprising a variable-capacitance element coupled to the pre-amplifier output, the variable-capacitance element operable to dynamically adjust an output capacitance of the pre-amplifier based on a bit of the n-bit binary-number represented by the capacitance being driven by the DAC and compared by the comparator.

11. The SAR_ADC of claim 10 wherein, the variable-capacitance element is operable to increase output capacitance of the pre-amplifier per bit as the DAC sequentially drives each of the bits from that representing the MSB to that representing a least significant bit (LSB).

12. The SAR_ADC of claim 11 wherein the reference buffer comprises adaptive power tuning circuit including m parallel drive-paths to provide $V_{REF}$ to the $V_{REF}$ node of the DAC, where m is a natural number ≤ to a number of capacitances of the DAC, and wherein the m parallel drive-paths include at least a first drive-path operable to drive all capacitances of the DAC, a second drive-path operable to drive fewer than all capacitances of the DAC, including capacitances representing bits of the n-bit binary-number greater than that representing the LSB, and a third drive-path operable to drive capacitances representing the MSB and a second most significant bit (MSB–1) of the n-bit binary-number.

13. A method of operating an Analog-to-Digital Converter including a comparator, a digital-to-analog converter (DAC) and a Successive Approximation Register (SAR) to output an n-bit binary-number approximating an analog input voltage ($V_{IN}$) to the converter, the method comprising:

coupling a first input of the comparator to $V_{IN}$ and a second input to first terminals of each of a plurality of capacitances in the DAC;

coupling first terminals of each of the capacitances to ground and second terminals of the capacitances to $V_{IN}$ to trap a charge proportional to $V_{IN}$ on the capacitances;

decoupling the first terminals of the capacitances from ground and switching the second terminals from $V_{IN}$ to ground driving a voltage ($V_{DAC}$) on the first terminals to a negative $V_{IN}$;

beginning with a capacitance of the capacitances representing a most significant bit (MSB) of the n-bit binary-number:

driving the $V_{DAC}$ on the first terminal of the capacitance in a positive direction by switching the second terminal from ground to a reference voltage ($V_{REF}$) from a reference buffer;

comparing the $V_{DAC}$ coupled to the second input from the capacitance being driven to the $V_{IN}$ coupled to the first input, and:

if $V_{IN}$ is $>V_{DAC}$ outputting from the comparator to the SAR a logic 1, signaling a switch coupling the second terminal of the capacitance being driven to remain closed, and setting the MSB of the n-bit binary-number as logic 1; and if $V_{IN}$ is $<V_{DAC}$ outputting from the comparator a logic 0, signaling the switch to couple the second terminal to ground, and resetting the MSB of the n-bit binary-number as logic 0; and repeating driving the $V_{DAC}$ and comparing $V_{DAC}$ to $V_{IN}$ for the of each capacitances sequentially from a capacitance representing a second most significant bit (MSB−1) of the n-bit binary-number to that representing a least significant bit (LSB), wherein driving the capacitance comprises dynamically tuning a drive-strength of the reference buffer based a bit of the n-bit binary-number represented by the capacitance being driven.

14. The method of claim 13 wherein the reference buffer comprises an adaptive power tuning circuit with a number (m) of parallel drive-paths to provide $V_{REF}$ to the DAC, where m is greater than 1 and less than the number of bits (n) in the n-bit binary-number.

15. The method of claim 14 wherein the m parallel drive-paths include at least a first drive-path operable to drive all capacitances of the DAC, and a second drive-path operable to drive fewer than all capacitances of the DAC.

16. The method of claim 15 wherein driving the number of capacitances comprises driving the capacitance representing a least significant bit (LSB) of the n-bit binary-number through only the first drive-path.

17. The method of claim 16 wherein driving the number of capacitances comprises driving the capacitance representing bits of the n-bit binary-number greater than that representing the LSB through the first and second drive-paths.

18. The method of claim 17 wherein the m parallel drive-paths further include a third drive-path, and wherein driving the number of capacitances comprises driving the capacitance representing the MSB and a capacitance representing a second most significant bit (MSB−1) of the n-bit binary-number through the first, second and third drive-paths.

19. The method of claim 13 wherein the comparator comprises a pre-amplifier coupled to the first input and second input and a set-reset (SR) latch coupled between a pre-amplifier output and the comparator output, and further comprising a variable-capacitance element coupled to the pre-amplifier output, and wherein comparing $V_{DAC}$ to $V_{IN}$ for each of the capacitances comprises adjusting the variable-capacitance element to dynamically adjust an output capacitance of the pre-amplifier based on the bit of the n-bit binary-number represented by the capacitance being driven by the DAC and compared by the comparator.

20. The method of claim 19 wherein adjusting the variable-capacitance element to dynamically adjust an output capacitance of the pre-amplifier comprises adjusting the variable-capacitance element to increase output capacitance of the pre-amplifier per bit as the DAC drives the capacitances representing each bit sequentially from the MSB to a least significant bit (LSB) of the n-bit binary-number.

\*  \*  \*  \*  \*